United States Patent
Alini et al.

(10) Patent No.: US 9,829,531 B2
(45) Date of Patent: Nov. 28, 2017

(54) DUAL GALVANIC ISOLATION BARRIERS AND MONITORING SYSTEMS AND METHODS

(71) Applicant: Maxim Integrated Products, Inc., San Jose, CA (US)

(72) Inventors: Roberto Alini, Dublin, CA (US); Larry Barnes, Raleigh, NC (US); Baris Posat, San Jose, CA (US); Gene Svoboda, Wake Forest, NC (US)

(73) Assignee: Maxim Integrated Products, Inc., San Jose, CA (US)

( * ) Notice: Subject to any disclaimer, the term of this patent is extended or adjusted under 35 U.S.C. 154(b) by 88 days.

(21) Appl. No.: 14/935,736

(22) Filed: Nov. 9, 2015

(65) Prior Publication Data

US 2017/0115336 A1  Apr. 27, 2017

Related U.S. Application Data

(60) Provisional application No. 62/245,591, filed on Oct. 23, 2015.

(51) Int. Cl.
*G01R 31/12* (2006.01)

(52) U.S. Cl.
CPC ..... *G01R 31/1263* (2013.01); *G01R 31/1218* (2013.01)

(58) Field of Classification Search
CPC .......... G01R 31/1263; G01R 31/12183; G01R 31/1218
See application file for complete search history.

(56) References Cited

U.S. PATENT DOCUMENTS

| | | |
|---|---|---|
| 6,873,065 B2 | 3/2005 | Haigh et al. |
| 8,169,108 B2 | 5/2012 | Dupuis et al. |
| 8,625,242 B2 | 1/2014 | Alini et al. |
| 8,643,138 B2 | 2/2014 | Dong |
| 8,660,489 B2 * | 2/2014 | Barrenscheen ........ G08C 17/06 375/258 |
| 8,736,343 B2 | 5/2014 | Chen et al. |
| 8,873,644 B1 | 10/2014 | Todsen et al. |
| 2015/0244275 A1 * | 8/2015 | Hinz .................. H02M 3/33507 363/21.17 |

* cited by examiner

*Primary Examiner* — David M Gray
*Assistant Examiner* — Michael Harrison

(57) ABSTRACT

A system includes a first galvanic isolator, a second galvanic isolator, a sensor, and a monitoring module. The first galvanic isolator includes a first electrical insulator. The second galvanic isolator is connected in series with the first galvanic isolator and includes a second electrical insulator. The sensor generates a first output signal based on an electrical characteristic of one of the first and second electrical insulators. The monitoring module, based on the first output signal, selectively generates a signal indicative of a failure of at least one of the first and second electrical insulators.

20 Claims, 10 Drawing Sheets

DUAL GALVANIC ISOLATION BARRIERS AND MONITORING SYSTEMS AND METHODS

CROSS-REFERENCE TO RELATED APPLICATIONS

This application claims the benefit of U.S. Provisional Application No. 62/245,591, filed on Oct. 23, 2015. The entire disclosure of the application referenced above is incorporated herein by reference.

FIELD

The present disclosure relates to insulation barriers and more particularly to series galvanic isolation barriers and barrier monitoring systems and methods.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Galvanic isolators may refer to devices using insulation to electrically separate electrical circuits in different power domains such that current does not flow from one electrical circuit in one power domain to another electrical circuit in another power domain. A galvanic isolator may transfer electrical power or electrical signals from one power domain to the other power domain across an insulation barrier. For example only, a transformer provides (inductive) galvanic isolation between a primary winding and a secondary winding. Transformers can be used for transferring power or signals between circuits of different power domains. Other example types of galvanic signal isolation include capacitive galvanic isolation, optical galvanic isolation, etc. Even using galvanic isolators, negligible alternating current (AC) currents may still flow between power domains due to parasitic capacitance.

Large voltages can exist between the power domains. This voltage appears directly across thin electrical insulation of galvanic isolation devices. The insulation, however, can deteriorate, such as due to aging and/or large voltage transients. Failure of the insulation allows unwanted current to flow between power domains.

SUMMARY

In a feature, a system is described. The system includes a first galvanic isolator, a second galvanic isolator, a sensor, and a monitoring module. The first galvanic isolator includes a first electrical insulator. The second galvanic isolator is connected in series with the first galvanic isolator and includes a second electrical insulator. The sensor generates a first output signal based on an electrical characteristic of one of the first and second electrical insulators. The monitoring module, based on the first output signal, selectively generates a signal indicative of a failure of at least one of the first and second electrical insulators.

In further features, at least one additional galvanic isolator is connected in series with the first and second galvanic isolators.

In further features, the monitoring module at least one of: disables at least one circuit; and stores an indicator in memory.

In further features, the sensor includes a field effect transistor (FET).

In further features, the sensor includes a capacitor.

In further features: the first galvanic isolator is a first capacitive isolation barrier; the first electrical insulator is implemented between first and second capacitor plates; the second galvanic isolator is a second capacitive isolation barrier; and the second electrical insulator is implemented between the second capacitor plate and a third capacitor plate.

In further features: the first galvanic isolator is a first inductive isolation barrier; the first electrical insulator is implemented between a first set of transformer windings; the second galvanic isolator is a second inductive isolation barrier; and the second electrical insulator is implemented between a second set of transformer windings.

In further features a third galvanic isolator includes a third electrical insulator, and a fourth galvanic isolator is connected in series with the third galvanic isolator and includes a fourth electrical insulator. A second sensor generates a second output signal based on a second electrical characteristic of one of the third and fourth electrical insulators. The monitoring module, based on the second output signal, selectively generates a signal indicative of a failure of at least one of the third and fourth electrical insulators.

In further features, the monitoring module selectively generates a signal indicative of a failure of at least one of the first, second, third, and fourth electrical insulators based on the first output signal and the second output signal.

In further features, the monitoring module selectively generates a signal indicative of a failure of at least one of the first, second, third, and fourth electrical insulators based on a difference between the first output signal and the second output signal.

In further features, the monitoring module generates the signal indicative of a failure of at least one of the first, second, third, and fourth electrical insulators when the difference is outside of a fixed predetermined range of values.

In further features, the monitoring module generates the signal indicative of a failure of at least one of the first, second, third, and fourth electrical insulators when the difference is outside a range of values set based on one or more measured parameters.

In further features, one of the first and second electrical insulators is configured to fail before the other one of the first and second electrical insulators.

In further features, characteristics of the first and second galvanic isolators are the same.

In further features, at least one characteristic of the first electrical insulator is different than that of the second electrical insulator.

In further features, a first capacitance of the first electrical insulator is different than a second capacitance of the second electrical insulator.

In further features, the monitoring module generates the signal indicative of the failure of at least one of the first and second electrical insulators when the first output signal is one of: (i) less than a first reference; and (ii) greater than a second reference that is greater than the first reference.

In further features, a second dual isolation barrier includes: a third galvanic isolator that includes a third electrical insulator; and a fourth galvanic isolator that is connected in series with the third galvanic isolator and that includes a fourth electrical insulator. A second sensor generates a second output signal based on a second electrical characteristic of one of the third and fourth electrical insulators. A third dual isolation barrier includes: a fifth galvanic isolator that includes a fifth electrical insulator; and a sixth galvanic isolator that is connected in series with the fifth galvanic isolator and that includes a sixth electrical insulator. A third sensor generates a third output signal based on a third electrical characteristic of one of the fifth and sixth electrical insulators. Based on the first output signal, the second output signal, and the third output signal, selectively generates a signal indicative of a failure of at least one of the first, second, third, fourth, fifth, and sixth electrical insulators.

In further features, the sensor measures one of: (i) current through the one of the first and second electrical insulators; and (ii) field across the one of the first and second electrical insulators.

In further features, the sensor is an optical sensor and optically measures photon emission of the one of the first and second electrical insulators.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A transmitter transmits data or power to a receiver via a dual insulation barrier. Dual insulation barriers include two galvanic isolators connected in series. Galvanic isolators include insulation barriers that can also be referred to as isolation barriers. The transmitter operates in a first power domain, while the receiver operates in a second power domain.

The galvanic isolators electrically insulate the transmitter from the receiver. More specifically, the galvanic isolators prevent current flow between the first and second power domains. Examples of galvanic isolators include, but are not limited to, optical insulation barriers, capacitive insulation barriers, inductive insulation barriers, and giant magneto resistive (GMR) insulation barriers.

The present disclosure describes a monitoring system that signals that one of the galvanic isolators is weakening or has failed before both galvanic isolators fail. This signaling enables repairs to be made or systems to be shut down before a complete failure of the dual insulation barrier. The dual insulation barrier includes one weaker galvanic isolator and one stronger galvanic isolator connected in series. The weaker galvanic isolator will fail earlier than the stronger galvanic isolator. As such, the stronger galvanic isolator may continue to function (and provide isolation) for some time after the weaker galvanic isolator has failed.

Figure 1:
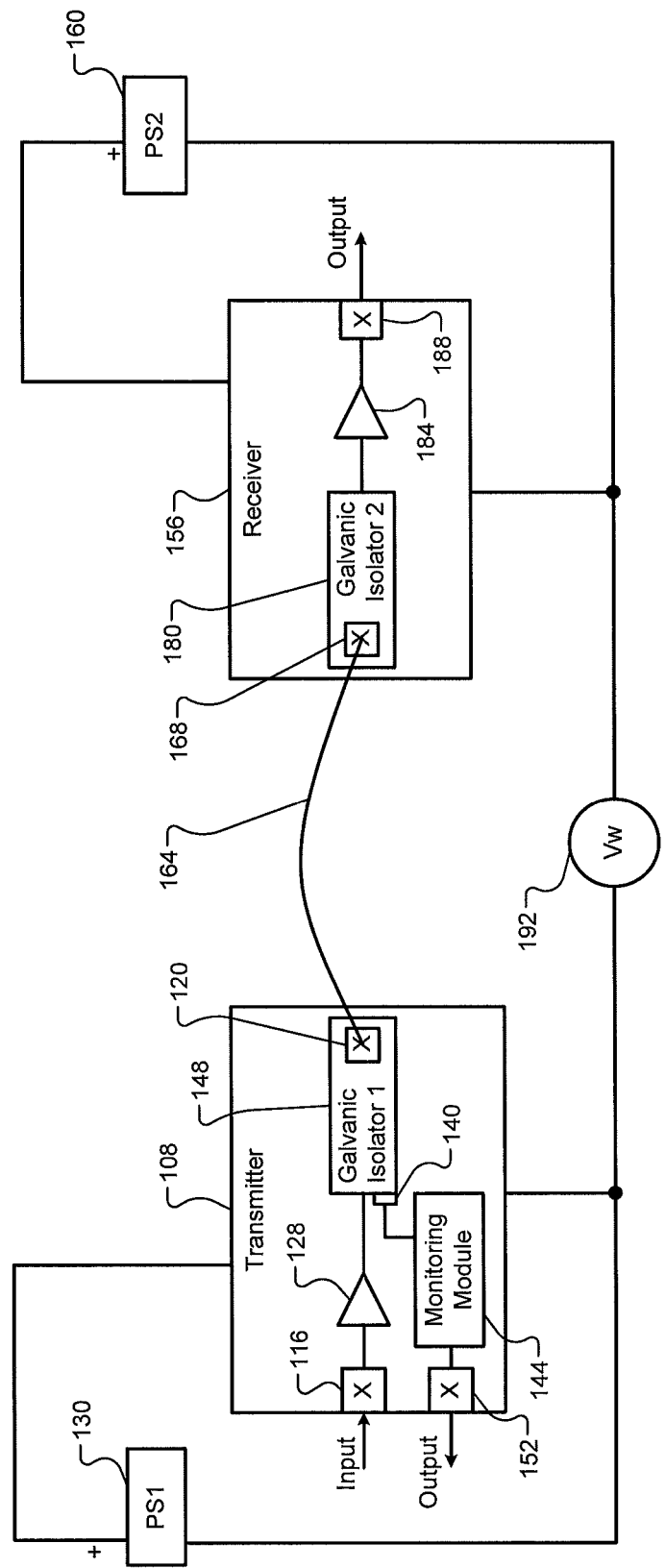
FIG. 1 includes a functional block diagram of an example system including dual insulation barriers.

Referring now to FIG. 1, a functional block diagram of an example system including dual insulation barriers is presented. A transmitter 108 includes a transmitter input 116 and one or more transmitter outputs, such as transmitter output 120. The transmitter 108 receives input signals via the transmitter input 116.

The transmitter 108 includes one or more active and/or passive components 128, such as an amplifier, a driver, etc. The component(s) 128 generate output signals to be output to a receiver 156 based on the input signals received at the input 116. The transmitter 108 operates in a first power domain based on the first voltage from a first power supply (PS1) 130.

The transmitter 108 includes a first sensor 140 and a monitoring module 144. The first sensor 140 detects characteristics of the insulation of a first galvanic isolator 148. For example, the first sensor 140 may detect a voltage across the insulation or current through the insulation. Other examples of insulation sensors include field sensors, current sensors, and optical sensors. Optical sensors measure photon emission. Photon emission increases when a failure occurs. The monitoring module 144 analyzes output signals from the first sensor 140 and outputs a signal via output 152 when a degradation limit of the insulation has been reached. In some examples multiple sensors may be used. In some examples, sensors and monitoring modules may additionally or alternatively be included in the receiver 156.

The receiver 156 operates in a second power domain based on a second voltage from a second power supply (PS2) 160. The first galvanic isolator 148 receives the output signals from the component(s) 128 and provides galvanic isolation between the first and second power domains. The first galvanic isolator 148 is connected between the component(s) 128 and the transmitter output 120.

A conductor 164 connects the transmitter output 120 with a receiver input 168. The conductor 164 may include, for example, one or more bond wires and/or other suitable types of electrical conductor.

The receiver 156 includes the input 168 and a second galvanic isolator 180. The second galvanic isolator 180 is in series with the first galvanic isolator 148 and provides galvanic isolation between the first and second power domains. The receiver 156 also includes one or more active and/or passive components 184, such as an amplifier, a driver, etc. The receiver 156 also includes a receiver output 188.

The second galvanic isolator 180 is connected between the receiver input 168 and the component(s) 184. The component(s) 184 generate output signals based on signals received via the input 168. The receiver 156 outputs signals via the receiver output 188.

The first and second galvanic isolators 148 and 180 may include, for example, capacitive insulation barriers, inductive insulation barriers, or giant magneto resistive (GMR) insulation barriers. In some implementations, the first and second galvanic isolators 148 and 180 can be different types of barriers.

A voltage difference between the first and second power domains is represented by voltage $V_w$ (withstand voltage) 192. The voltage difference may be an alternating current (AC) voltage or a direct current (DC) voltage. The voltage difference may be transient (e.g., in the case of a lightning strike or a power surge) or continuous.

Each of the insulation barriers of the first and second galvanic isolators 148 and 180 is chosen to sustain a maximum possible value of the withstand voltage Vw 192. For example only, if the maximum transient voltage for a system may be 2.5 kilo-Volts (kV), each of the insulation barriers of the first and second galvanic isolators 148 and 180 may be able to withstand 2.5 kilo-Volts (kV) or greater. The insulation barriers of the first and second galvanic isolators 148 and 180 may be chosen to satisfy an Underwriters' Laboratory (UL) standard or another suitable standard for the system in which the insulation barriers are implemented.

The first and second galvanic isolators 148 and 180 may be designed so that one of the first and second galvanic isolators 148 and 180 may fail before the other one of the first and second galvanic isolators 148 and 180. For example only, the insulation barrier of the first galvanic isolator 148 may be physically thicker than the insulation barrier of the second galvanic isolator 180. Additionally or alternatively, insulation barrier of the first galvanic isolator 148 may be configured to age faster than the insulation barrier of the second galvanic isolator 180. The use of differing insulation barriers makes it unlikely that both of the first and second galvanic isolators 148 and 180 will fail within a short time of each other. This allows time for corrective action to be taken before both of the first and second galvanic isolators 148 and 180 fail.

Figure 2:
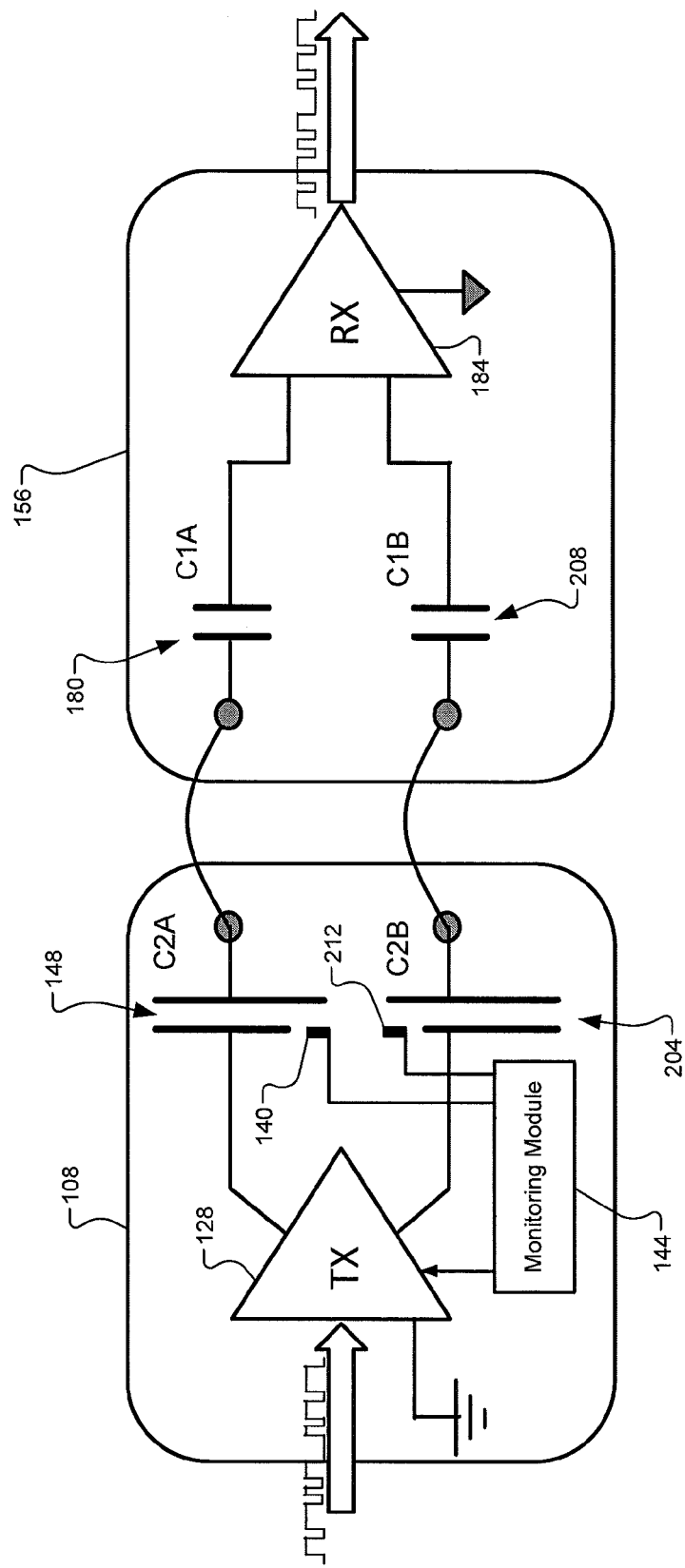
FIG. 2 includes a functional block diagram of an example system including dual capacitive insulation barriers.

FIG. 2 includes a functional block diagram of an example system where the first and second galvanic isolators 148 and 180 are capacitive insulation barriers. Third and fourth galvanic isolators 204 and 208 are also included. The third and fourth galvanic isolators 204 and 208 are also capacitive insulation barriers. The insulators of the first and third galvanic isolators 148 and 204 may have the same electrical characteristics, such as thickness, or material, or capacitance. Similarly, the insulators of the second and fourth galvanic isolators 180 and 208 may have the same electrical characteristics, such as thickness, material, or capacitance.

Electrical characteristics of the insulators of the first and third galvanic isolators 148 and 204, however, may be different than electrical characteristics of the insulators of the second and fourth galvanic isolators 180 and 208 in various implementations. The insulators may have different electrical characteristics, for example, so the insulators of the second and fourth galvanic isolators 180 and 208 sustain a different amount of stress during operation than the insulators of the first and third galvanic isolators 148 and 204, respectively. While the example of the transmitter 108 and the receiver 156 each including two galvanic isolators is shown and discussed, the transmitter 108 and the receiver 156 may each include only one insulation barrier or more than two insulation barriers. While electrical characteristics of the insulators are provided as examples, the amount of stress sustained by insulators may be varied in other ways, such as through characteristics, shape, and/or connection angle of a conductor that connects galvanic isolators.

As an example, in the case of capacitive insulation barriers, the insulation of the second and fourth galvanic isolators 180 and 208 may provide capacitances that are less than the capacitances provided by the insulation of the first and third galvanic isolators 148 and 204. In this manner, the second and fourth galvanic isolators 180 and 280 will be stressed to a greater extent than the first and third galvanic isolators 148 and 204.

For example only, the capacitance of the second galvanic isolator 180 may be one-half of the capacitance of the first galvanic isolator 148, and the capacitance of the fourth galvanic isolator 208 may be one-half of the capacitance of the third galvanic isolator 204. With this example, the first galvanic isolator 148 may receive approximately ⅓ of the withstand voltage Vw 192, while the second galvanic isolator 180 may receive approximately ⅔ of the withstand voltage Vw 192. Similarly, the third galvanic isolator 204 may receive approximately ⅓ of the withstand voltage Vw 192, while the fourth galvanic isolator 208 may achieve approximately ⅔ of the withstand voltage Vw 192. The insulation of the second and fourth galvanic isolators 180 and 208 will therefore age more quickly than the insulation of the first and third galvanic isolators 148 and 204 and, therefore, will tend to fail sooner than the insulation of the first and third galvanic isolators 148 and 204.

A galvanic isolator may be said to have failed when the insulation of the galvanic isolator breaks down and current is conducted across the insulator. Failed galvanic isolator do not provide the intended electrical isolation. Failure of the insulation may either be permanent or temporary. A permanent failure may indicate a permanent loss of insulation's insulating characteristic such that a conductive path occurs across the insulation. A temporary or partial failure of insulation may indicate that at one time current flowed through the insulation but is no longer flowing and a permanent conductive path across the insulation does not exist. A spark gap is an example of a temporary insulation failure. Insulation exists initially, fails when arching occurs, and is restored when the arc is extinguished.

Since dual insulation barriers include two galvanic isolators connected in series and each of the insulators can sustain the maximum possible value of the withstand voltage Vw 192, electrically isolated operation may continue even after one galvanic isolator of a dual insulation barrier has failed. For example, even after the insulation of the second galvanic isolator 180 has failed, isolated operation may continue as the insulator of the first galvanic isolator 148 continues to provide isolation between the first and second power domains. In the example of FIG. 2, a second sensor 212 is provided with the third galvanic isolator 204.

Figure 3:
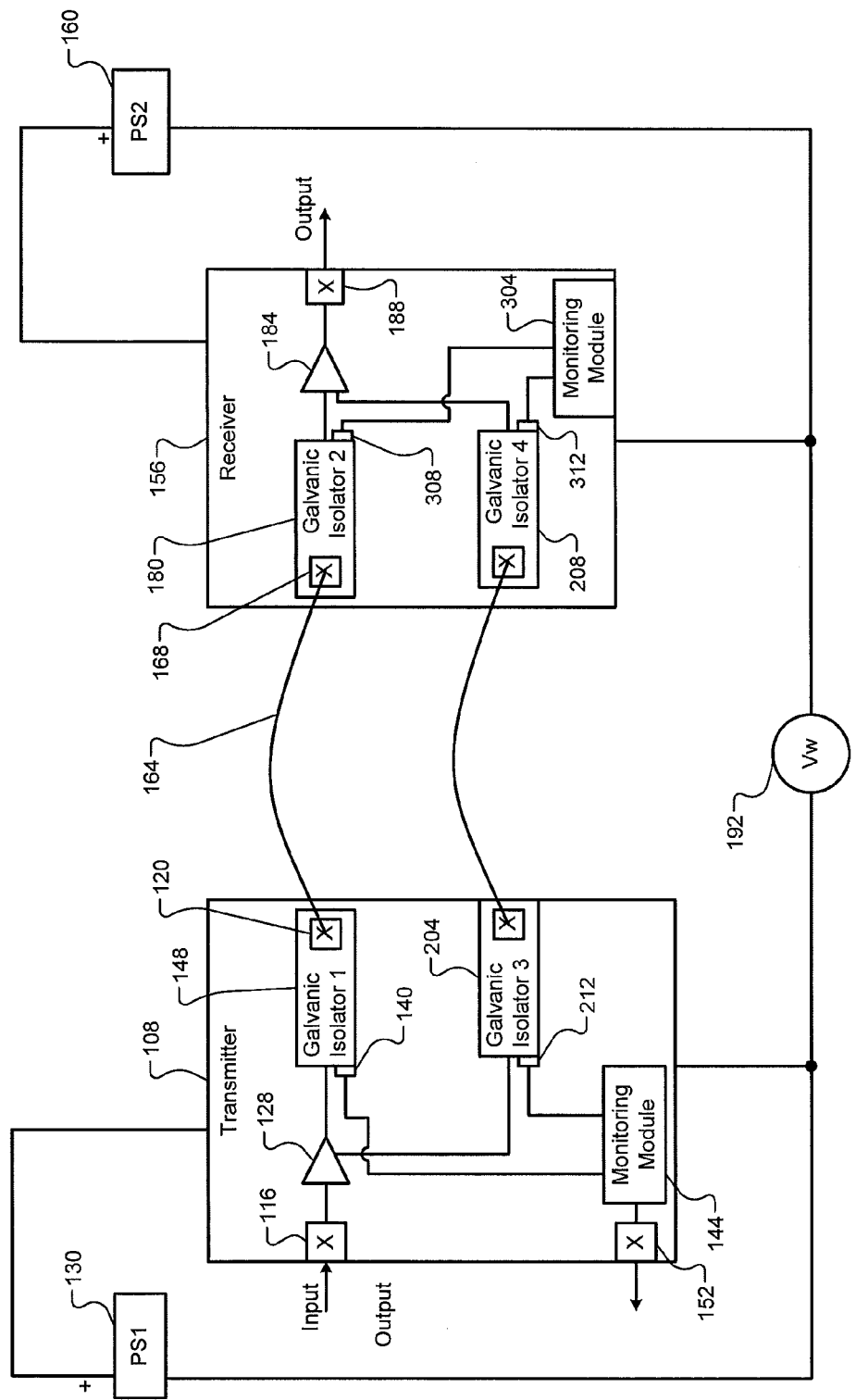
FIG. 3 includes a functional block diagram of an example system including multiple dual insulation barriers and multiple monitoring modules.

In FIG. 3, the system is shown including multiple monitoring modules. One or both of the transmitter 108 and the receiver 156 may include a monitoring module. For example, in FIG. 3, the transmitter 108 includes the monitoring module 144, and the receiver 156 includes a monitoring module 304. While both the transmitter 108 and the receiver 156 are shown as including a monitoring module, in various implementations, only one of the transmitter 108 and the receiver 156 includes a monitoring module. FIG. 1 illustrates an example system where the receiver 156 does not include a monitoring module. Alternatively, only the receiver 156 may include a monitoring module.

One or more sensors are included with each monitoring module. For example, the first and second sensors 140 and 212 are included with the monitoring module 144 in the example of FIG. 3. Third and fourth sensors 308 and 312 may be included with the monitoring module 304. In other examples, such as discussed further below, only one sensor may be included with a monitoring module.

The monitoring module 144 monitors output signals from the first and second sensors 140 and 212. The monitoring module 144 diagnoses failure or impending failure of one or more galvanic isolators based on signals from at the first and second sensors 140 and 212.

The monitoring module 304 monitors output signals from the third and fourth sensors 308 and 312. The third sensor 308 monitors the second galvanic isolator 180, and the fourth sensor 312 monitors the fourth galvanic isolator 208. The monitoring module 304 diagnoses failure of one or more insulation barriers based on signals from the third and fourth sensors 308 and 312.

Figure 4:
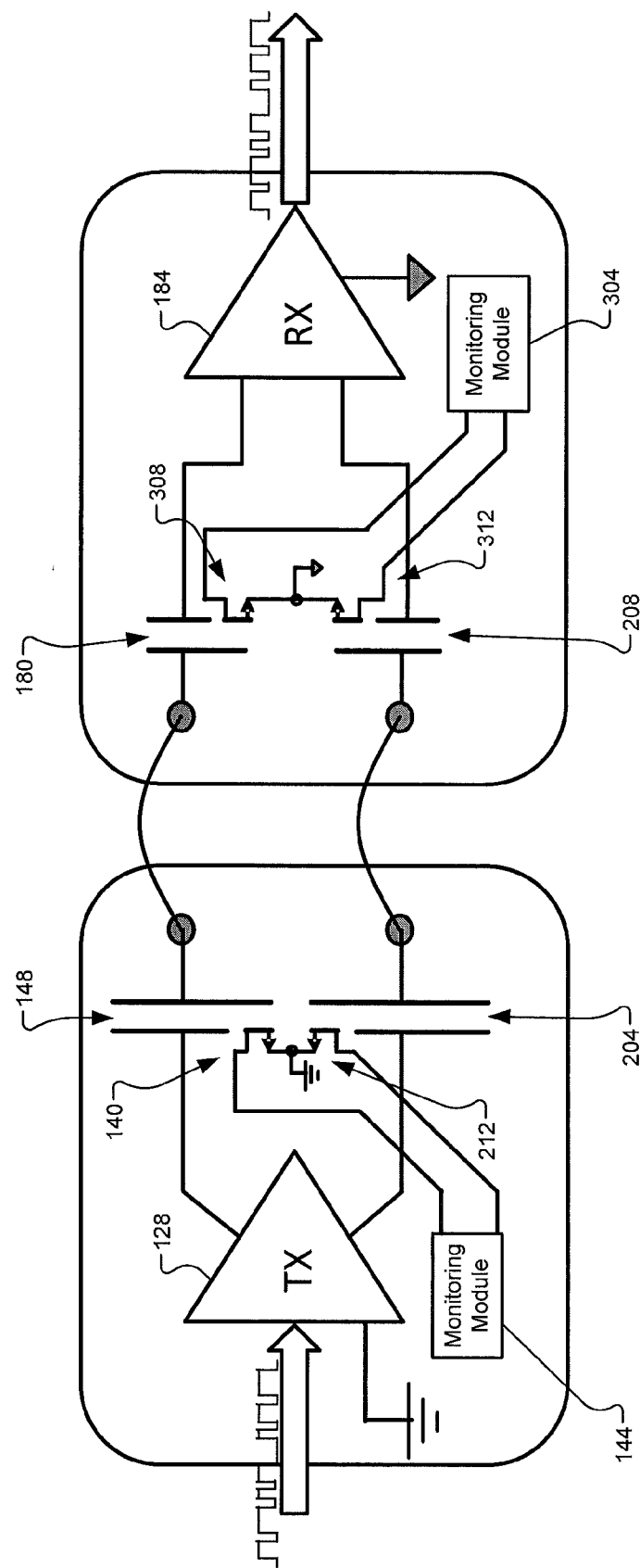
FIG. 4 includes a functional block diagram including an example system including metal oxide semiconductor field effect transistor (MOSFET) sensing elements.

The sensors 140, 212, 308, and 312 may include, for example, voltage sensing elements, (e.g., thick gate) metal oxide semiconductor field effect transistor (MOSFET) sensing elements, current sensing elements, photon sensing elements, or another suitable type of sensing device. Examples of FETs include n-type FETs, p-type FETs, or a combination of n-type and p-type FETs. FIG. 4 includes a functional block diagram including an example system where the first, second, third, and fourth sensors 140, 212, 308, and 312 including MOSFET sensing elements. Gate terminals of MOSFET sensing elements can be floating or biased.

The sensors may utilize one of the conductors of the associated galvanic isolators to generate the respective output signals. For example, in the examples of FIGS. 2 and 4, the first sensor 140 generates an output signal based on the charge on the capacitor plate connected to the output 120 of the first galvanic isolator 148. Similarly, the second sensor 212 generates an output signal based on the charge on the capacitor plate connected to the output of the third galvanic isolator 204. The third and fourth sensors 308 and 312 generate output signals based on charge on capacitor plates of the second and fourth galvanic isolators 180 and 208, respectively.

The monitoring module 144 may determine the state of the insulation by analyzing sensor output signals individually, or the monitoring module 144 may determine the state of the insulation by comparing sensor output signals. For example only, the monitoring module 144 may analyze the difference between the output signals from the first and second sensors 140 and 212. The monitoring module 144 may also apply a predetermined gain to the difference. In various implementations, the monitoring module 144 may use a combination of individual signal analysis and comparative analysis to determine the state of the insulation.

Figure 5:
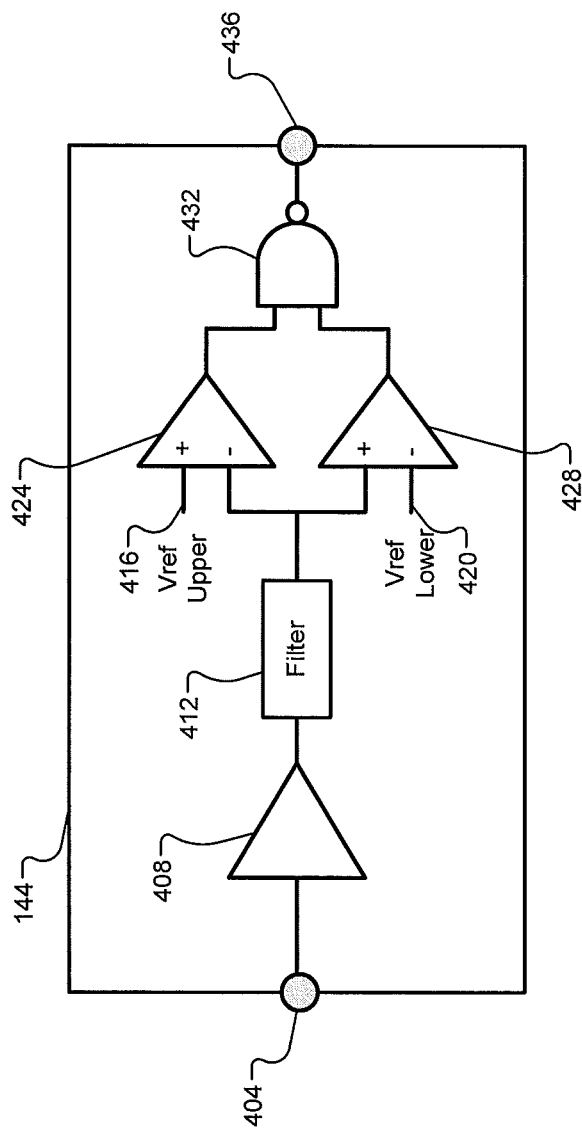
FIGS. 5 and 6 include functional block diagrams of example monitoring modules.

FIG. 5 includes a functional block diagram of an example implementation of the monitoring module 144. The monitoring module 144 analyzes a single sensor output signal 404, such as the output signal of the first sensor 140. The output signal 404 may be maybe amplified by component (e.g., amplifier) 408 and may be filtered by component (e.g., one or more filters) 412 before being compared to first and second reference voltages 416 and 420 by first and second comparators 424 and 428, respectively.

A logic gate 432, such as a not-AND (NAND) logic gate, determines a status of the insulation based on the outputs of the first and second comparators 424 and 428. The logic gate 432 outputs a status of the insulation via 436. The logic gate 432 may sets its output to a low state and indicate that the insulation has not failed (i.e., is intact) when insulation failure has not been detected. The logic gate 432 may sets its output to a high state to indicate an insulation failure.

The following sensor output signals are examples only and, in some implementations, could be reversed. Also, while the example of using a NAND logic gate is provided, another type of logic gate could be used. In the example of FIG. 1, when the signal input to the first and second comparators 424 and 428 is between the first and second reference voltages 416 and 420, the monitoring module 144 may indicate that neither the first galvanic isolator 148 nor the second galvanic isolator 180 has failed. The outputs of first and second comparators 424 and 428 would be in the high state when the signal input to the first and second comparators 424 and 428 is between the first and second reference voltages 416 and 420, thus indicating no insulation failure.

When only the first galvanic isolator 148 has failed, the signal input to the first and second comparators 424 and 428 will be lower than both the first and second reference voltages 416 and 420. The outputs of the first and second comparators 424 and 428 will therefore be high and low, respectively. The logic gate 432 will accordingly set its output 436 to the high state, indicating an insulation failure.

When only the second galvanic isolator 180 has failed, the signal input to the first and second comparators 424 and 428 will be higher than both the first and second reference voltages 416 and 420. The outputs of the first and second comparators 424 and 428 will therefore be low and high, respectively, and the logic gate 432 will set its output 436 to the high state, indicating an insulation failure. In some implementations the first and second reference voltages 416 and 420 may be fixed, predetermined voltages. The first and second reference voltages 416 and 420 may, for example, be a fraction (less than 1/1) of the withstand voltage Vw 192. As one example only, the first and second reference voltages 416 and 420 may be set to approximately 1/100 of the withstand voltage Vw 192, although another fraction may be used. Also, the first and second reference voltages 416 and 420 may be different fractions of the withstand voltage Vw 192. In other implementations, the first and second reference voltages 416 and 420 may be learned values based on the historical output of first sensor 140.

Figure 6:
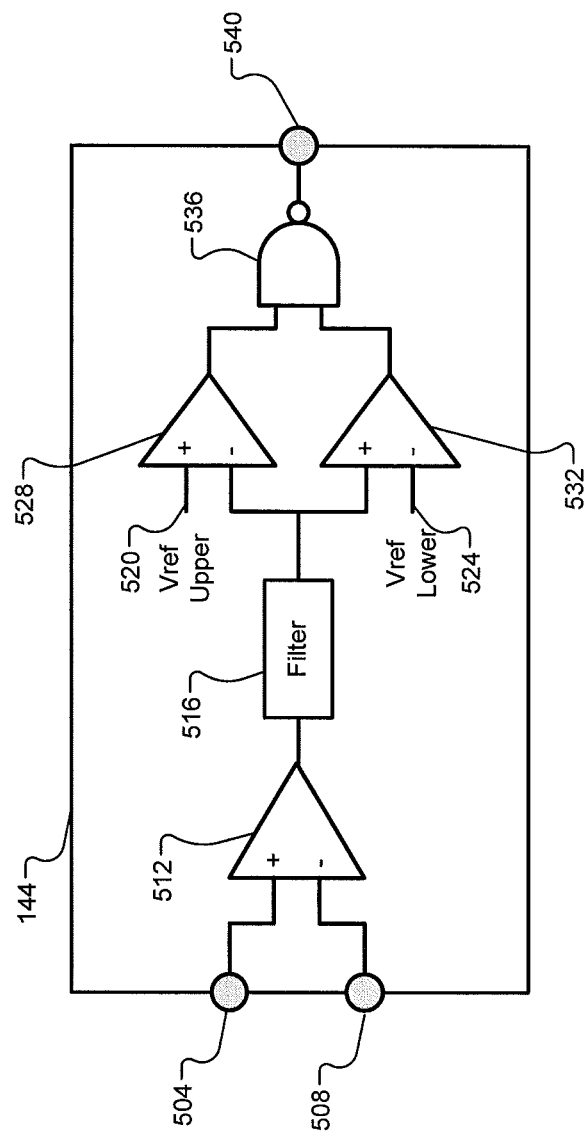

FIG. 6 includes a functional block diagram of an example implementation of a monitoring module that compares the signals from two sensors connected to inputs 504 and 508. Examples include, for example, the monitoring module 144 of FIG. 2, FIG. 3, or FIG. 4, or the monitoring module 304 of FIG. 3 or FIG. 4.

A differential amplifier 512 determines a difference between the (voltage) signals from the two sensors and amplifies the difference. The difference may be filtered by component (e.g., one or more filters) 516 before being compared to first and second reference voltages 520 and 524 by first and second comparators 528 and 532, respectively.

A logic gate 536, such as a not-AND (NAND) logic gate, determines a status of the insulation based on the outputs of the first and second comparators 528 and 532. The logic gate 536 outputs a status of the insulation via 540. The logic gate 536 may sets its output to a low state and indicate that the insulation has not failed (i.e., is intact) when insulation failure has not been detected. The logic gate 536 may sets its output to a high state to indicate an insulation failure. While the example of using a NAND logic gate is provided, another type of logic gate could be used.

Using the example of the monitoring module 144 of FIG. 3, the output of the first sensor 140 may be connected to the input 504, and the output of the second sensor 212 may be connected to the input 508. If the first and third galvanic isolators 148 and 204 have the same or similar electrical characteristics, the second and fourth galvanic isolators have the same or similar electrical characteristics, and the first and second sensors 140 and 212 are similar, the output voltage of the first sensor 140 may be similar to the output voltage of the second sensor 212. When none of the galvanic isolators 148, 180, 204, and 208 has failed, the difference between the output voltages of the first and second sensors 140 and 212 may be approximately zero. Also, the difference signal input to the first and second comparators 528 and 532 may be approximately mid-range and be between the first and second reference voltages 520 and 524. The outputs of the first and second comparators 528 and 532 will therefore both be in the high state, which causes the output 540 to be low, which indicates no insulation failure.

When only one of the galvanic isolators 148 and 208 fail, the output of the first sensor 140 will be lower than the output of the second sensor 212. The difference input to the first and second comparators 528 and 532 may therefore be lower than both the first and second reference voltages 520 and 524. The outputs of the first and second comparators 528 and 532 will be high and low, respectively. This will cause the logic gate 536 to set the output 540 to the high state, indicating an insulation failure. If only one of the second and third galvanic isolators 180 and 204 fails, the output of the first sensor 140 will be greater than the output of the second sensor 212. The difference input to the first and second comparators 528 and 532 may therefore be greater than both the first and second reference voltages 520 and 524. The outputs of the first and second comparators 528 and 532 will be low and high, respectively. This will cause the logic gate 536 to set the output 540 to high, indicating an insulation failure. In some implementations the first and second reference voltages 520 and 524 may be fixed, predetermined voltages. The first and second reference voltages 520 and 524 may, for example, be a fraction (less than 1/1) of the withstand voltage Vw 192. In other implementations, the first and second reference voltages 520 and 524 may be learned values based on the historical output of the first and second sensors 140 and 212.

A monitoring module (e.g., the monitoring module 144 and/or the monitoring module 304) may indicate that one or more insulation barriers has failed, for example, by illuminating an indicator lamp, generating a message on a display, setting a predetermined flag in memory, disabling data transmission, and/or in another suitable manner. An indication that an insulation barrier has failed may notify a user that one or more components (e.g., chips) including the failed insulation barrier(s) should be replaced.

Figure 7:
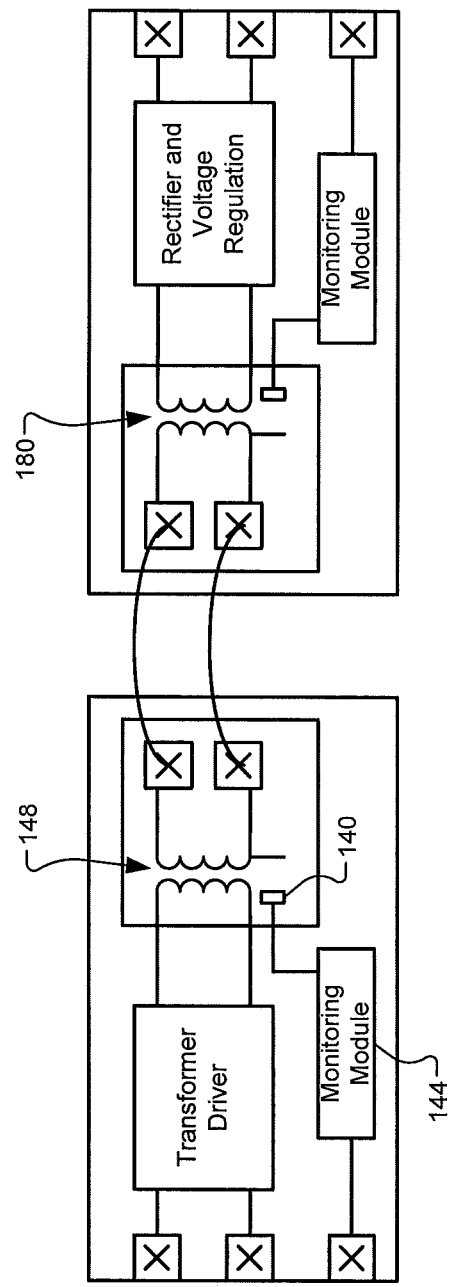
FIG. 7 includes a functional block diagram of an example isolated direct current DC to DC converter.

FIG. 7 is a functional block diagram of an example isolated direct current (DC) to DC converter. The isolated DC to DC converter includes a transformer driver, dual isolation transformers, insulation sensors, and monitoring modules. Due to the inherent capacitance between transformer windings and the need for insulation between transformer windings, monitoring modules and methods for transformer isolation barriers may be similar to, or may be identical to, those used for capacitor isolation barriers.

Figure 8:
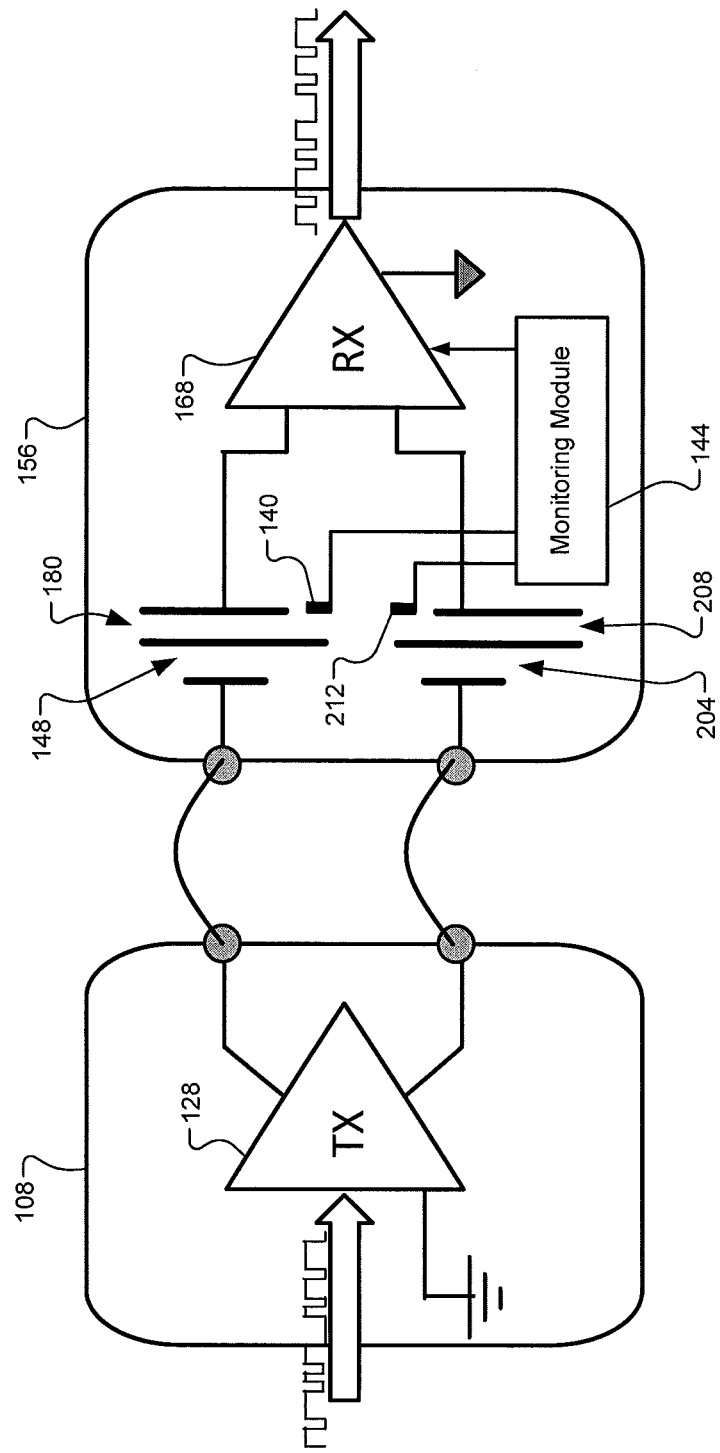
FIG. 8 includes a functional block diagram of an example system where both galvanic isolators of a dual isolation barrier are implemented with a receiver.

FIG. 8 is a functional block diagram of an example system including merged dual capacitive isolation barriers with sensors and a monitoring module. In FIG. 8, all of the capacitive isolators are implemented with the receiver 156. Zero galvanic isolators are implemented with the transmitter 108. The first and second (capacitive) galvanic isolators 148 and 180 share a common capacitor plate. The third and fourth (capacitive) galvanic isolators 204 and 208 share a common capacitor plate. The insulation barriers, however, remain distinct.

Figure 9:
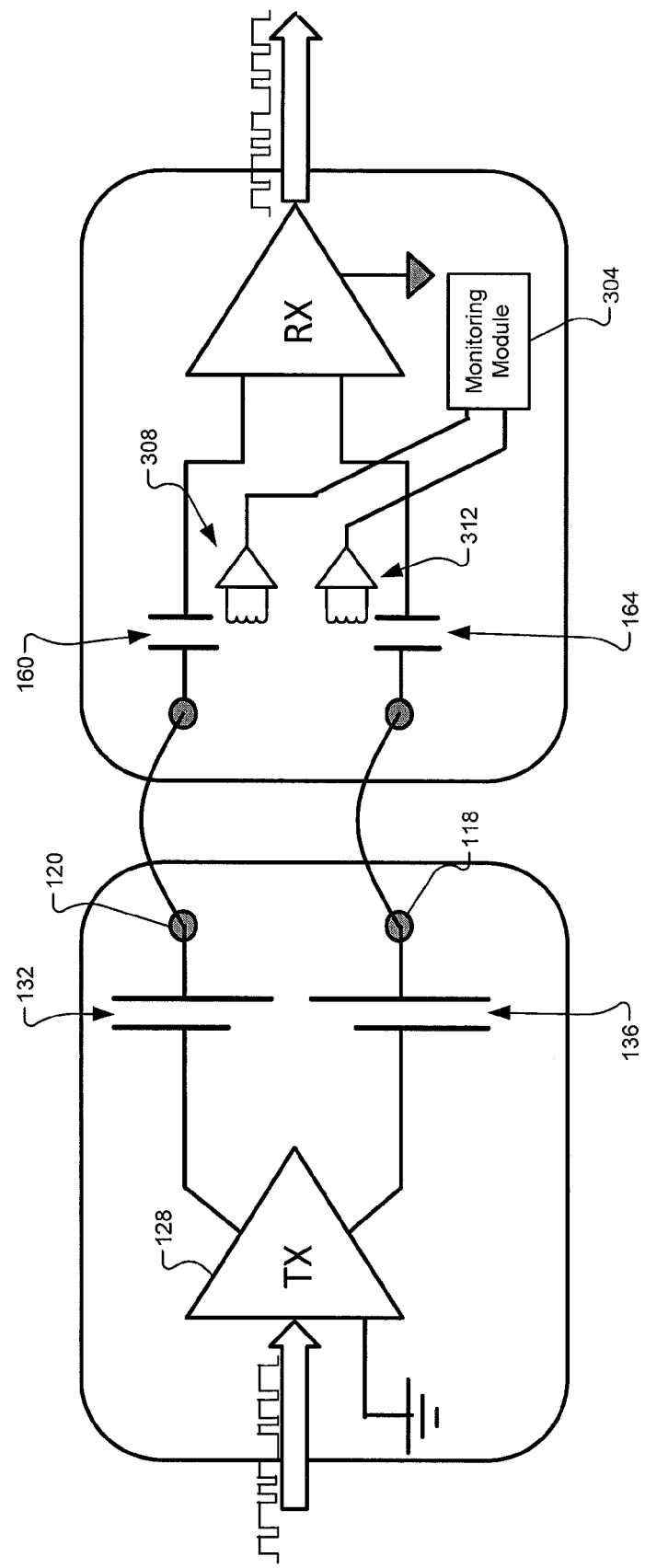
FIG. 9 includes a functional block diagram of an example system including a dual isolation barrier and inductive sensors.

FIG. 9 is a functional block diagram of an example system including dual capacitive insulation barriers, induction based sensors, and a monitoring module. In this example, the third and fourth sensors 308 and 312 each include a coil that is proximate to the associated galvanic isolation barrier. When the isolation barrier breaks down, a pulse of current may flow between the capacitor plates as the capacitor discharges. This current pulse induces a voltage in coil of the associated sensor. The monitoring module 304 may identify and indicate a failure when this voltage is sensed.

Figure 10:
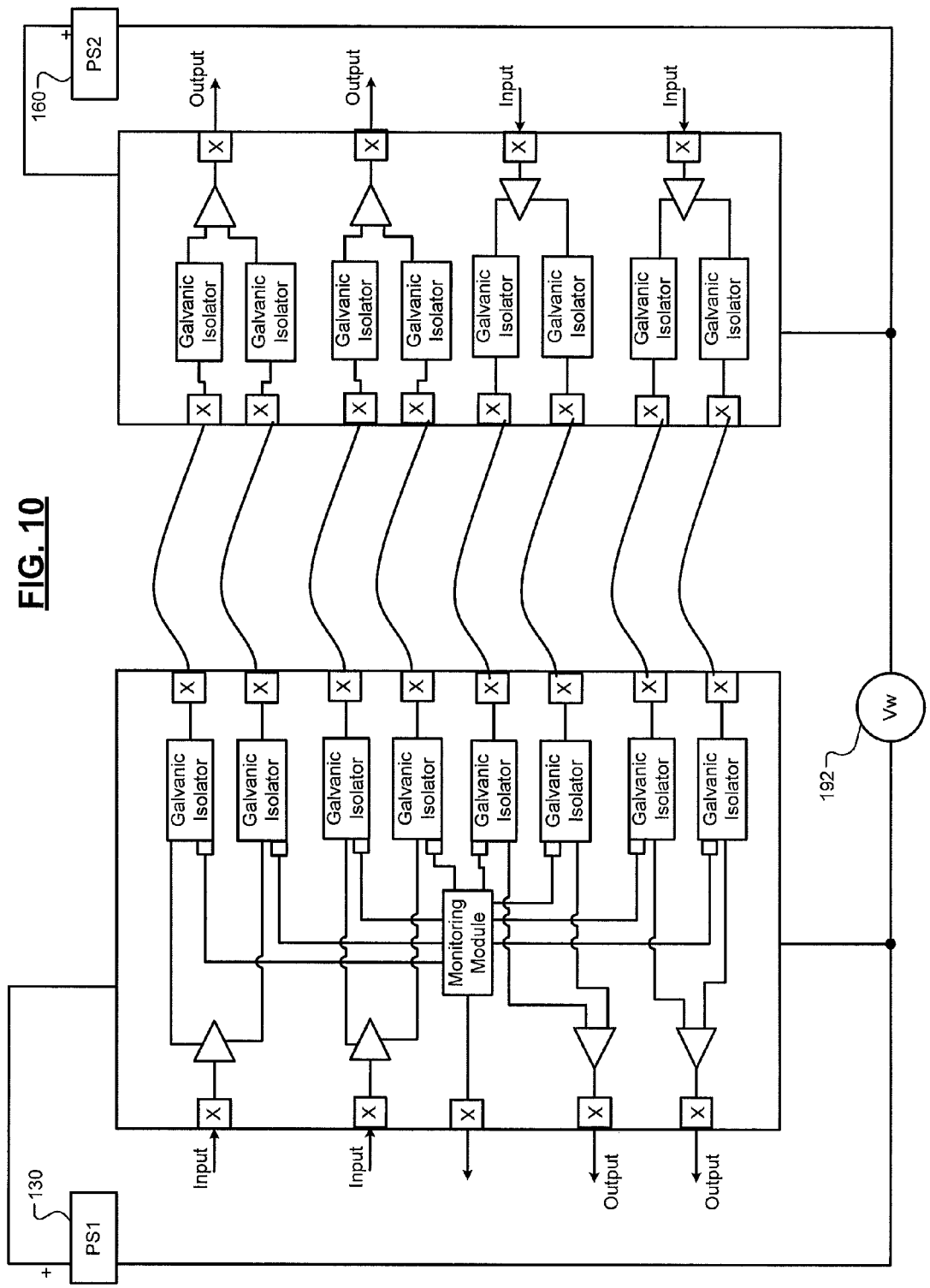
FIG. 10 includes a functional block diagram of an example system including more than two dual isolation barriers, sensors for the dual isolation barriers, and a monitoring module.

Some system may include multiple dual isolation barriers. FIG. 10 includes a functional block diagram of an example system including multiple dual isolation barriers, multiple sensors, and a monitoring module that analyses signals from multiple sensors. As discussed above, different types of barriers may be connected in series in some implementations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects.

The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A system comprising:
   a first galvanic isolator that includes a first electrical insulator;
   a second galvanic isolator that is connected in series with the first galvanic isolator and that includes a second electrical insulator;
   a sensor that generates a first output signal based on an electrical characteristic of one of the first and second electrical insulators; and
   a monitoring module that, based on the first output signal, selectively generates a signal indicative of a failure of at least one of the first and second electrical insulators.

2. The system of claim 1 further comprising at least one additional galvanic isolator connected in series with the first and second galvanic isolators.

3. The system of claim 1 wherein the monitoring module at least one of: disables at least one circuit; and stores an indicator in memory.

4. The system of claim 1 wherein the sensor includes a field effect transistor (FET).

5. The system of claim 1 wherein the sensor includes a capacitor.

6. The system of claim 1 wherein:
   the first galvanic isolator is a first capacitive isolation barrier;
   the first electrical insulator is implemented between first and second capacitor plates;
   the second galvanic isolator is a second capacitive isolation barrier; and
   the second electrical insulator is implemented between the second capacitor plate and a third capacitor plate.

7. The system of claim 1 wherein:
   the first galvanic isolator is a first inductive isolation barrier;
   the first electrical insulator is implemented between a first set of transformer windings;
   the second galvanic isolator is a second inductive isolation barrier; and
   the second electrical insulator is implemented between a second set of transformer windings.

8. The system of claim 1 further comprising:
   a third galvanic isolator that includes a third electrical insulator;
   a fourth galvanic isolator that is connected in series with the third galvanic isolator and that includes a fourth electrical insulator; and
   a second sensor that generates a second output signal based on a second electrical characteristic of one of the third and fourth electrical insulators,
   wherein the monitoring module, based on the second output signal, selectively generates a signal indicative of a failure of at least one of the third and fourth electrical insulators.

9. The system of claim 8 wherein the monitoring module selectively generates a signal indicative of a failure of at least one of the first, second, third, and fourth electrical insulators based on the first output signal and the second output signal.

10. The system of claim 8 wherein the monitoring module selectively generates a signal indicative of a failure of at least one of the first, second, third, and fourth electrical insulators based on a difference between the first output signal and the second output signal.

11. The system of claim 10 wherein the monitoring module generates the signal indicative of a failure of at least one of the first, second, third, and fourth electrical insulators when the difference is outside of a fixed predetermined range of values.

12. The system of claim 10 wherein the monitoring module generates the signal indicative of a failure of at least one of the first, second, third, and fourth electrical insulators when the difference is outside a range of values set based on one or more measured parameters.

13. The system of claim 1 wherein one of the first and second electrical insulators is configured to fail before the other one of the first and second electrical insulators.

14. The system of claim 1 wherein characteristics of the first and second galvanic isolators are the same.

15. The system of claim 1 wherein at least one characteristic of the first electrical insulator is different than that of the second electrical insulator.

16. The system of claim 1 wherein a first capacitance of the first electrical insulator is different than a second capacitance of the second electrical insulator.

17. The system of claim 1 wherein the monitoring module generates the signal indicative of the failure of at least one of the first and second electrical insulators when the first output signal is one of: (i) less than a first reference; and (ii) greater than a second reference that is greater than the first reference.

18. The system of claim 1 further comprising:
a second dual isolation barrier that includes:
    a third galvanic isolator that includes a third electrical insulator; and
    a fourth galvanic isolator that is connected in series with the third galvanic isolator and that includes a fourth electrical insulator;
a second sensor that generates a second output signal based on a second electrical characteristic of one of the third and fourth electrical insulators;
a third dual isolation barrier that includes:
    a fifth galvanic isolator that includes a fifth electrical insulator; and
    a sixth galvanic isolator that is connected in series with the fifth galvanic isolator and that includes a sixth electrical insulator; and
a third sensor that generates a third output signal based on a third electrical characteristic of one of the fifth and sixth electrical insulators,
wherein, based on the first output signal, the second output signal, and the third output signal, the monitoring module selectively generates a signal indicative of a failure of at least one of the first, second, third, fourth, fifth, and sixth electrical insulators.

19. The system of claim 1 wherein the sensor measures one of: (i) current through the one of the first and second electrical insulators; and (ii) field across the one of the first and second electrical insulators.

20. The system of claim 1 wherein the sensor is an optical sensor and optically measures photon emission of the one of the first and second electrical insulators.

* * * * *

UNITED STATES PATENT AND TRADEMARK OFFICE
CERTIFICATE OF CORRECTION

PATENT NO. : 9,829,531 B2
APPLICATION NO. : 14/935736
DATED : November 28, 2017
INVENTOR(S) : Roberto Alini et al.

It is certified that error appears in the above-identified patent and that said Letters Patent is hereby corrected as shown below:

In the Specification

Column 6, Line 12          Delete "280" and insert -- 208 --

Signed and Sealed this
Thirtieth Day of October, 2018

Andrei Iancu
*Director of the United States Patent and Trademark Office*